(12) United States Patent
Zhu et al.

(10) Patent No.: US 11,233,114 B2
(45) Date of Patent: Jan. 25, 2022

(54) ORGANIC LIGHT-EMITTING DIODE ARRAY SUBSTRATE AND MANUFACTURING METHOD THEREOF, DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Sheng Zhu, Beijing (CN); Zhengyuan Zhang, Beijing (CN); Peng Sui, Beijing (CN); Can Yuan, Beijing (CN); Xiaojun Zhuo, Beijing (CN); Tao Wang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 795 days.

(21) Appl. No.: 16/073,096

(22) PCT Filed: Dec. 5, 2017

(86) PCT No.: PCT/CN2017/114554
§ 371 (c)(1),
(2) Date: Jul. 26, 2018

(87) PCT Pub. No.: WO2018/223630
PCT Pub. Date: Dec. 13, 2018

(65) Prior Publication Data
US 2021/0210587 A1 Jul. 8, 2021

(30) Foreign Application Priority Data
Jun. 8, 2017 (CN) .......................... 201710427376.4

(51) Int. Cl.
*H01L 27/32* (2006.01)
*H01L 51/56* (2006.01)

(52) U.S. Cl.
CPC .......... *H01L 27/3279* (2013.01); *H01L 51/56* (2013.01); *H01L 2227/323* (2013.01)

(58) Field of Classification Search
CPC .................................................. H01L 27/3279
See application file for complete search history.

(56) References Cited

U.S. PATENT DOCUMENTS 7,663,306 B2  2/2010  Imamura
8,149,188 B2  4/2012  Kishi
(Continued)

FOREIGN PATENT DOCUMENTS

CN          1622716 A    6/2005
CN        101777576 A    7/2010
(Continued)

OTHER PUBLICATIONS

Mar. 14, 2018—(WO) International Search Report and Written Opinion Appn PCT/CN2017/114554 with English Translation.
(Continued)

*Primary Examiner* — Douglas M Menz
(74) *Attorney, Agent, or Firm* — Banner & Witcoff, Ltd.

(57) ABSTRACT

An organic light-emitting diode array substrate and manufacturing method thereof, and display apparatus are provided. The organic light-emitting diode array substrate includes: a base substrate; a first metal layer disposed on the base substrate; a first insulating layer disposed on a side of the first metal layer far away from the base substrate; a second metal layer disposed on a side of the first insulating layer far away from the base substrate; the first metal layer includes a first power line, and the second metal layer includes a second power line; the second power line is
(Continued)

connected in parallel with the first power line through a first via hole which penetrates the first insulating layer.

19 Claims, 4 Drawing Sheets

(56) References Cited

U.S. PATENT DOCUMENTS

| | | |
|---|---|---|
| 8,791,453 B2 | 7/2014 | Kanegae |
| 8,841,661 B2 | 9/2014 | Akimoto et al. |
| 8,946,791 B2 | 2/2015 | Basker et al. |
| 2003/0111954 A1 | 6/2003 | Koo et al. |
| 2005/0116232 A1 | 6/2005 | Kim et al. |
| 2006/0158095 A1 | 7/2006 | Imamura |
| 2007/0035225 A1 | 2/2007 | Lee et al. |
| 2011/0127537 A1 | 6/2011 | Matsumuro |
| 2017/0069692 A1 | 3/2017 | Lee et al. |
| 2018/0219057 A1 | 8/2018 | Han |

FOREIGN PATENT DOCUMENTS

| | | |
|---|---|---|
| CN | 106206670 A | 12/2016 |
| JP | 2004109812 A | 4/2004 |
| JP | 2004193129 A | 7/2004 |
| JP | 2005215354 A | 8/2005 |
| JP | 2006201421 A | 8/2006 |
| JP | 2010055070 A | 3/2010 |
| JP | 2010226097 A | 10/2010 |
| WO | 2008004348 A1 | 1/2008 |
| WO | 2012042566 A1 | 4/2012 |

OTHER PUBLICATIONS

Feb. 3, 2021—(EP) Extended European Search Report Appn 17892067.4.

Feb. 19, 2020—(IN) Indian Office Action Appn 201847028134 with English Translation.

Oct. 11, 2021—(JP) First Office Action Appn 2018-539151 with English translation.

ORGANIC LIGHT-EMITTING DIODE ARRAY SUBSTRATE AND MANUFACTURING METHOD THEREOF, DISPLAY APPARATUS

The application is a U.S. National Phase Entry of International Application No. PCT/CN2017/114554 filed on Dec. 5, 2017, designating the United States of America and claiming priority to Chinese Patent Application No. 201710427376.4 filed on Jun. 8, 2017. The present application claims priority to and the benefit of the above-identified applications and the above-identified applications are incorporated by reference herein in their entirety.

TECHNICAL FIELD

Embodiments of the present disclosure relate to an organic light-emitting diode (OLED) array substrate and a method for manufacturing an organic light-emitting diode array substrate, and a display apparatus.

BACKGROUND

An organic light-emitting diode (OLED) is a new generation of display device. Compared with liquid crystal display (LCD), the organic light-emitting diode has advantages of self-luminous, fast response and wide viewing angle, and the organic light-emitting diode is able to be used in flexible display, transparent display, and three dimensional (3D) display, etc.

SUMMARY

At least one embodiment of the present disclosure provides an organic light-emitting diode array substrate, and the organic light-emitting diode array substrate includes: a base substrate; a first metal layer disposed on the base substrate; a first insulating layer disposed on a side of the first metal layer far away from the base substrate; a second metal layer disposed on a side of the first insulating layer far away from the base substrate; the first metal layer comprises a first power line, and the second metal layer comprises a second power line; the second power line is connected in parallel with the first power line through a first via hole which penetrates the first insulating layer.

For example, in the organic light-emitting diode array substrate provided by at least one embodiment of the present disclosure, a resistivity of a material of the first metal layer is less than a resistivity of a material of the second metal layer.

For example, in the organic light-emitting diode array substrate provided by at least one embodiment of the present disclosure, the material of the first metal layer comprises at least one of copper, copper alloy, silver, and silver alloy; the material of the second metal layer comprises at least one of nickel, molybdenum, tantalum, aluminum, titanium, and alloy of any combination thereof.

For example, in the organic light-emitting diode array substrate provided by at least one embodiment of the present disclosure, the second power line is connected in parallel with the first power line through at least two first via holes which penetrate the first insulating layer.

For example, in the organic light-emitting diode array substrate provided by at least one embodiment of the present disclosure, a width of the first power line is greater than a width of the second power line.

For example, in the organic light-emitting diode array substrate provided by at least one embodiment of the present disclosure, the first power line is in a planar structure.

For example, the organic light-emitting diode array substrate provided by at least one embodiment of the present disclosure further includes a pixel structure, the pixel structure includes a driving transistor, and the driving transistor includes a gate electrode, a gate insulating layer, a second insulating layer and a first electrode; the first electrode is electrically connected to the second power line through a second via hole which penetrates both the second insulating layer and the gate insulating layer.

For example, in the organic light-emitting diode array substrate provided by at least one embodiment of the present disclosure, a material of the gate electrode is identical to a material of the second power line, the gate electrode and the second power line are arranged in a same layer and spaced apart from each other.

For example, in the organic light-emitting diode array substrate provided by at least one embodiment of the present disclosure, the driving transistor further comprises an active layer, a material of the active layer comprises a metal oxide.

For example, in the organic light-emitting diode array substrate provided by at least one embodiment of the present disclosure, the metal oxide material comprises at least one of indium tin oxide (ITO), indium zinc oxide (IZO), indium gallium oxide (IGO), gallium zinc oxide (GZO), zinc oxide (ZnO), indium oxide ($In_2O_3$), and aluminum zinc oxide (AZO).

At least one embodiment of the present disclosure further provides a display apparatus, and the display apparatus includes any one of the above mentioned organic light-emitting diode array substrates.

At least one embodiment of the present disclosure further provides a method for manufacturing an organic light-emitting diode array substrate, and the method includes: providing a base substrate; depositing a first metal film on the base substrate and patterning the first metal film to form a first metal layer; depositing a first insulating film on a side of the first metal layer far away from the base substrate, and performing a patterning process on the first insulating film to form a first insulating layer; depositing a second metal film on a side of the first insulating layer far away from the base substrate, and performing a patterning process on the second metal film to form a second metal layer; the first metal layer includes a first power line, and the second metal layer includes a second power line; the second power line is connected in parallel with the first power line through a first via hole which penetrates the first insulating layer.

For example, in the manufacturing method provided by at least one embodiment of the present disclosure, a resistivity of the first metal layer is less than a resistivity of the second metal layer.

For example, in the manufacturing method provided by at least one embodiment of the present disclosure, a width of the first power line is greater than a width of the second power line.

For example, the manufacturing method provided by at least one embodiment of the present disclosure further includes forming a pixel structure, forming the pixel structure includes forming a driving transistor, forming the driving transistor includes forming a gate electrode, a gate insulating layer, a second insulating layer and a first electrode; the first electrode is electrically connected to the second power line through a second via hole which penetrates both the second insulating layer and the gate insulating layer.

For example, in the manufacturing method provided by at least one embodiment of the present disclosure, a material of the gate electrode is identical to a material of the second power line, the gate electrode and the second power line are arranged in a same layer and spaced apart from each other.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

An organic light-emitting diode (OLED) array substrate comprises a plurality of pixel units, and each of the pixel units comprises a switching transistor, a driving transistor, and an OLED display device. OLED is an electric current type light emitting device, which mainly comprises an anode, a cathode, and an organic material functional layer formed between the anode and the cathode. The general working principle of the OLED is that the organic material functional layer is driven by the electric field formed by the anode and the cathode to emit light through the injection and recombination of carriers. A driving transistor which is electrically connected to the anode or the cathode of the OLED functions as a current limiting device. If a resistivity of the electrode material of the driving transistor is too high or a resistivity of the power line is too large, the voltage drop will be large, and the large voltage drop makes different influences on the pixel units at different positions, which harms the uniformity of display.

Figure 1:
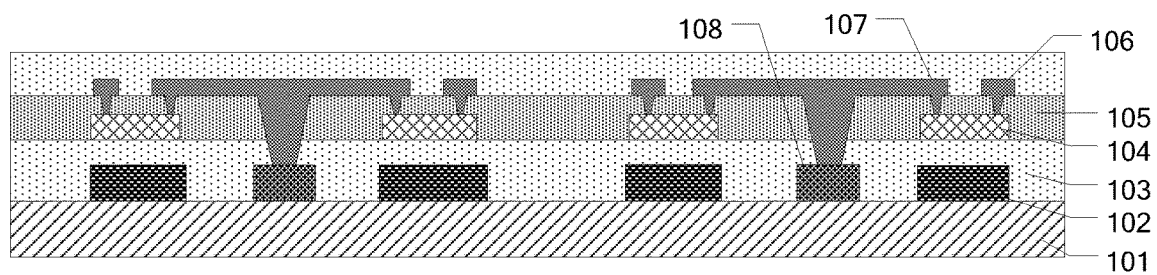
FIG. 1 is a schematic diagram of a sectional structure of an organic light-emitting diode array substrate.

FIG. 1 is a schematic diagram of a sectional structure of an organic light-emitting diode array substrate, as illustrated in FIG. 1, the OLED array substrate comprises a base substrate 101 and a driving transistor disposed on the base substrate 101. The OLED array substrate further comprises an organic light-emitting diode (OLED) and a storage capacitor (not shown) and so on which are connected to the driving transistor. The driving transistor comprises a gate electrode 102, a source electrode and a drain electrode. The power line 108 and the gate electrode 102 are formed in a same patterning process, and the power line 108 and the gate electrode 102 are made of a same material. For example, the material of the gate electrode 102 and the material of the power line 108 are both aluminum. The power line 108 and the gate electrode 102 are disposed at a same layer and are spaced apart from each other. The driving transistor further comprises a gate insulating layer 103 disposed on the gate electrode 102 and the power line 108, an active layer 104 disposed on the gate insulating layer 103; an insulating layer 105 is disposed on the active layer 104, a first source/drain electrode 106 (for example, a source electrode or a drain electrode) and a second source/drain electrode 107 (correspondingly, for example, a drain electrode or a source electrode) are disposed on the insulating layer 105. Among the driving transistors of a pair of adjacent pixel units, the first source/drain electrode 106 of one of the driving transistor is connected to the first source/drain electrode 106 of another driving transistor; the first source/drain electrode 106 of the one driving transistor and the first source/drain electrode of another driving transistor are electrically connected to the power line 108 through the via hole which penetrates the insulating layer 105 and the gate insulating layer 103.

At present, the process of preparing the electrodes of the driving transistor using aluminum with a good stability is relatively mature. However, aluminum has a relatively large resistivity, if the electrodes (for example, the gate electrode, the first source/drain electrode and the second source/drain electrode and so on) and the power lines of the driving transistor are made of aluminum, the voltage drop is relatively large, the large voltage drop harms the display uniformity of the display apparatus. In general, the width of the aluminum metal electrode or the width of the aluminum metal line is widened to reduce the voltage drop, but the aperture ratio is reduced due to the large widths of the electrodes or the metal lines, and the production cost is further increased.

The inventors of the present disclosure notice that the resistivity of copper or silver is low, and the voltage drop is reduced in the case that the electrodes (for example, the gate electrode, the first source/drain electrode and the second source/drain electrode and so on) and the power lines of the driving transistor are made of copper or silver. However, copper and silver are easily to be oxidized, and in the process of patterning a metal film made of copper or silver, etching rate for copper and silver using an etching solution is low, and it is hard to control the etching degree, as a result, the uniformity of the copper electrode or the silver electrode is reduced. Based on the above observations, the inventors of the present disclosure recognize that if the electrodes of the driving transistor are made of aluminum, the second power line is formed in the process of forming the gate electrode of the driving transistor, the first power line is made of copper, the first power line and the second power line are connected through the via hole to reduce the resistance of the power lines (including the first power line and the second power line), thereby the voltage drop is reduced as a whole, and simultaneously the large voltage drop is avoided in the case that the power line is made of a metal such as aluminum with good stability, and the problem of immature process is avoided in the case that the electrodes are made of copper or silver, or metal alloys including at least one of copper and silver with low resistivity.

At least one embodiment of the present disclosure provides an organic light-emitting diode array substrate, and the organic light-emitting diode array substrate comprises: a base substrate; a first metal layer disposed on the base substrate; a first insulating layer disposed on a side of the first metal layer far away from the base substrate; a second metal layer disposed on a side of the first insulating layer far away from the base substrate; the first metal layer comprises a first power line, and the second metal layer comprises a second power line; the second power line is connected in parallel with the first power line through a first via hole which penetrates the first insulating layer.

In the embodiments of the present disclosure, the electrodes and the second power line of the driving transistor are made of aluminum having a good stability; the first power line is made of copper or silver with a relatively low resistivity or a metal alloy comprising at least one of copper and silver, the first power line and the second power line are connected in parallel through the via hole to reduce the voltage drop. In this way, the large voltage drop is avoided in the case that the power line is made of a metal material such as aluminum with a good stability, and the problem of immature process is avoided in the case that the electrodes are made of copper or silver, or metal alloys comprising at least one of copper and silver with low resistivity.

Figure 2A:
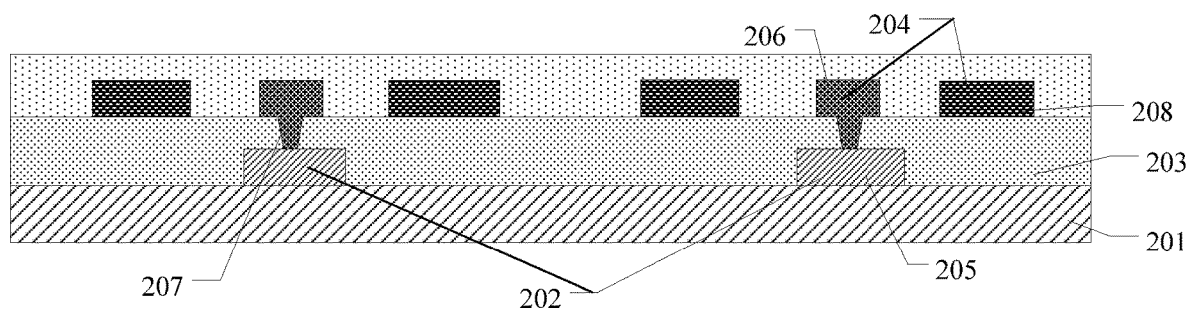
FIG. 2a is a schematic diagram of a sectional structure of an organic light-emitting diode array substrate provided by an embodiment of the present disclosure.

At least one embodiment of the present disclosure provides an organic light-emitting diode (OLED) array substrate. FIG. 2a is a schematic diagram of a sectional structure of an organic light-emitting diode array substrate provided by an embodiment of the present disclosure. For example, as illustrated in FIG. 2a, the organic light-emitting diode (OLED) array substrate comprises a base substrate 201, a first metal layer 202 disposed on the base substrate 201, a first insulating layer 203 disposed on a side of the first metal layer 202 away from the base substrate 201, and a second metal layer 204 disposed on a side of the first insulating layer 203 away from the base substrate 201. The first metal layer 202 comprises a first power line 205, the second metal layer 204 comprises a second power line 206. The second power line 206 is connected in parallel with the first power line 205 through a first via hole 207 which penetrates the first insulating layer 203. The second metal layer 204 further comprises a metal electrode disposed in a same layer as the second power line 206, in this way, the steps of the operation process is reduced, and the complexity of the process is simplified. In FIG. 2a, the second power line 206 is disposed in a same layer as the gate electrode 208 of the driving transistor.

For example, the OLED array substrate comprises a display region and a peripheral region outside the display region. The display region is also referred to as an AA (Active Area), and the display region is generally used for displaying. The peripheral region may be used for arranging a driving circuit, packaging a display panel, and the like. For example, in the peripheral region, the first power line 205 is electrically connected with the second power line 206, and in the display region, the first power line 205 is electrically connected with the second power line 206, in this way, the first power line 205 and the second power line 206 are connected at both ends respectively to form a parallel circuit, or both ends that the first power line 205 and the second power line 206 connected to each other are located in the display region. In the case that the first power line 205 receives a voltage signal and transmits the voltage signal, and the voltage signal reaches the second power line 206 that electrically connected to the first power line 205, the second power line 206 transmits the voltage signal simultaneously with the first power line 205 as a branch of the voltage signal, which is equivalent to the first power line 205 and the second power line 206 forming the parallel circuit, in this way, the resistance in the process of electrical signal transmission is reduced; or the second power line 206 receives the voltage signal firstly, in the case that the voltage signal reaches the first power line 205 electrically connected to the second power line 206, the first power line 205 as a branch for transmitting the voltage signal simultaneously with the second power line 206; or the first power line 205 and the second power line 206 receives the voltage signal simultaneously, the first power line 205 and the second power line 206 transmit the voltage signal simultaneously as two branches.

For example, a resistivity of a material of the first metal layer 202 is less than a resistivity of a material of the second metal layer 204. In this way, the metal electrode made of a same material as the second power line 206 and the first power line 205 have different resistivities, and the first power line 205 and the second power line 206 are connected in parallel, in this way, the large voltage drop is avoided in the case that the power line is made of a metal material such as aluminum with a good stability, and the problem of immature process is avoided in the case that the electrodes are made of copper or silver, or metal alloys comprising at least one of copper and silver with low resistivity.

For example, the material of the first metal layer 202 comprises at least one of copper, copper alloy, silver, and silver alloy.

For example, the material of the second metal layer 204 comprises at least one of nickel, molybdenum, tantalum, aluminum, titanium, and alloy of any combination thereof. For example, the alloy comprises nickel molybdenum alloy, nickel niobium alloy, niobium molybdenum alloy, aluminum molybdenum alloy, titanium molybdenum alloy, aluminum antimony alloy, aluminum titanium alloy, titanium rhenium alloy, nickel molybdenum tantalum alloy.

For example, the second power line 206 is connected in parallel with the first power line 205 by at least two first via holes 207 which penetrate the first insulating layer 203, in this way, the first power line 205 and the second power line 206 are connected in parallel at a plurality of positions to further reduce voltage drop. For example, the plurality of first via holes 207 are formed in a same patterning process. Compared to forming one first via hole 207, forming a plurality of first via holes 207 at a same time require no additional operations, and only require to choose different masks.

Figure 2B:
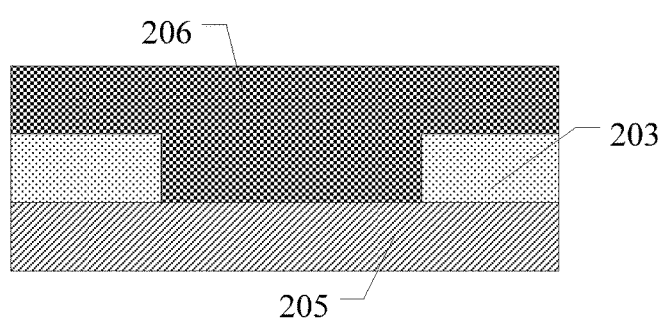
FIG. 2b is a schematic diagram of a sectional structure in which a second power line and a first power line are connected in parallel provided by an embodiment of the present disclosure.

For example, FIG. 2b is a schematic diagram of a sectional structure that a second power line and a first power line are connected in parallel provided by an embodiment of the present disclosure. As illustrated in FIG. 2b, the second power line 206 is connected in parallel with the first power line 205 through a first via hole which penetrates the first insulating layer 203.

Figure 3:
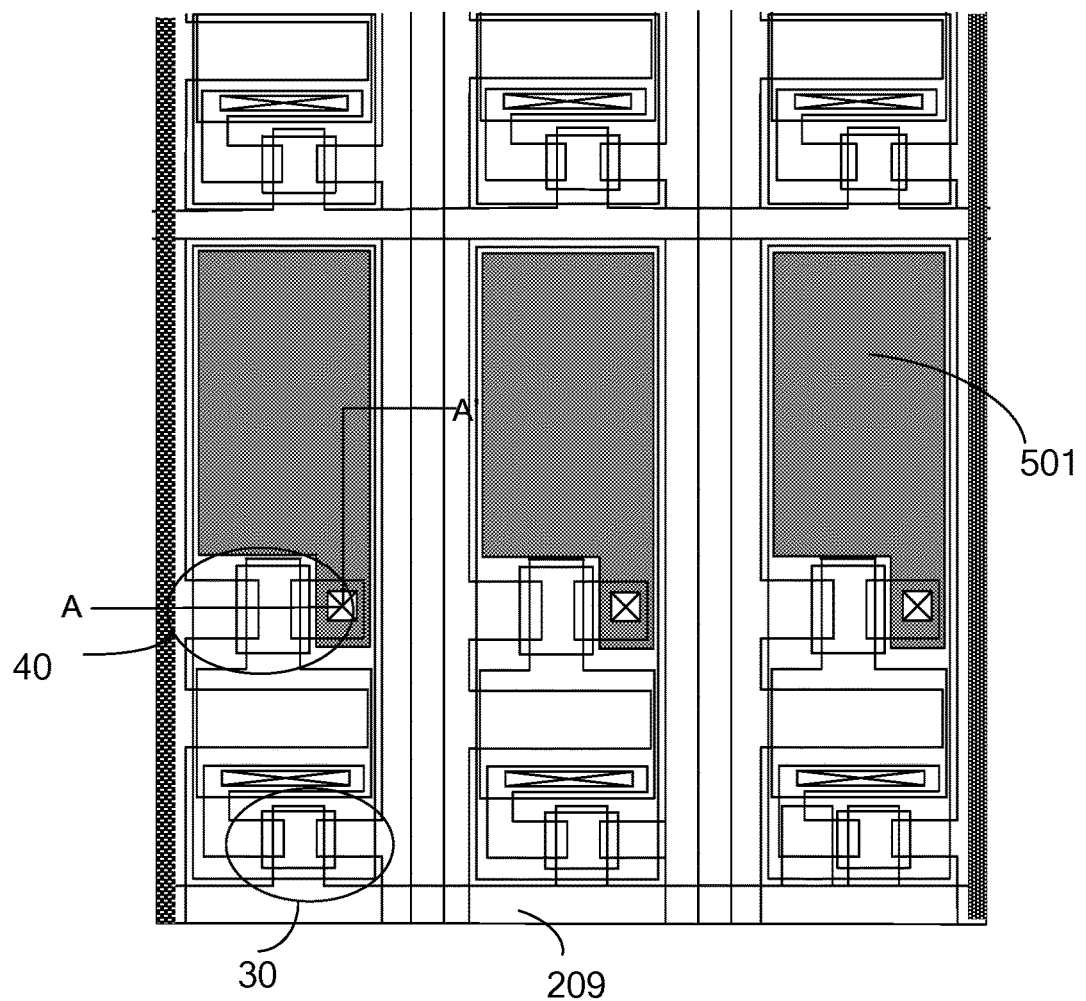
FIG. 3 is a schematic diagram of a planar structure of an organic light-emitting diode array substrate provided by an embodiment of the present disclosure.
Figure 4:
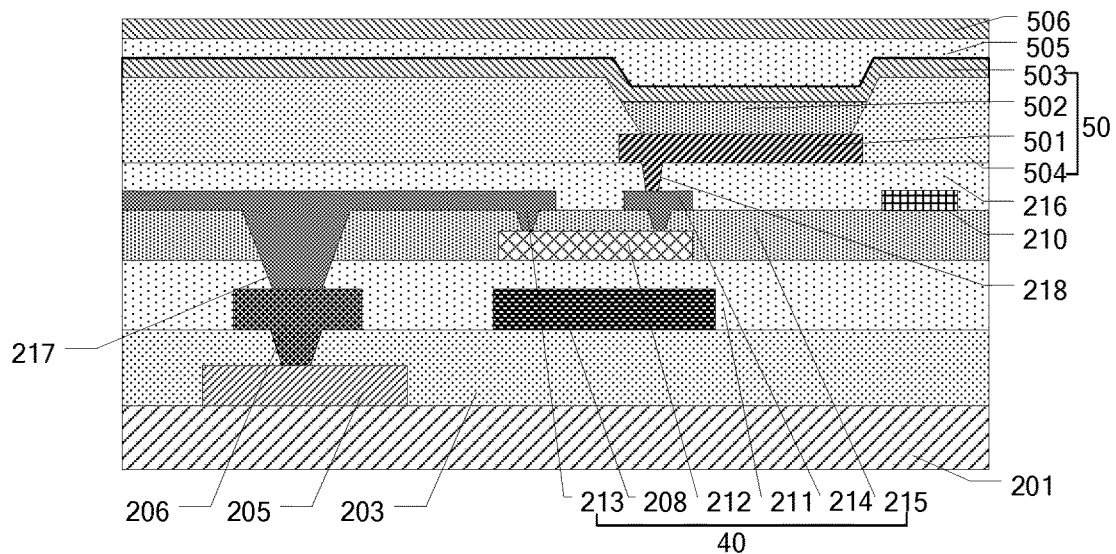
FIG. 4 is a schematic diagram of a sectional structure of the organic light-emitting diode array substrate along the line A-A' in FIG. 3.

For example, FIG. 3 is a schematic diagram of a planar structure of an organic light-emitting diode array substrate provided by an embodiment of the present disclosure; FIG. 4 is a schematic diagram of a sectional structure of the organic light-emitting diode array substrate along the line A-A' in FIG. 3.

As illustrated in FIG. 3 and FIG. 4, the OLED array substrate further comprises data lines 210 disposed on the base substrate 201 and gate lines 209 connected to the gate electrodes 208. For example, the gate lines 209 and the data lines 210 are intersected with each other for defining the regions of the pixel units. Pixel structures are disposed in the regions. Exemplary, each of the pixel structures comprises a switching transistor 30, a driving transistor 40, and an OLED device 50 (including a third electrode 501, a fourth electrode 503, an organic material functional layer 502, and a pixel defining layer 504), the gate electrode of the switching transistor 30 and the first electrode of the switching transistor 30 are connected to the gate line 209 and the data line 210, the second electrode of the switching transistor 30 is connected to the gate electrode of the driving transistor 40, and the first electrode and the second electrode of the driving transistor 40 are connected to the first power line 205, the second power line 206 and the OLED device 50. For example, the second power line 206 is electrically connected to the first electrode 213 (for example, the input electrode of the driving transistor 40, for example, a source electrode or a drain electrode) of the driving transistor 40; a third insulating layer 216 (for example, a first passivation layer) is disposed between the third electrode 501 of the OLED device 50 and the driving transistor 40. The third electrode 501 is electrically connected to the second electrode 214 of the driving transistor 40 (i. e. the output electrodes 40 of the driving transistor) through the third via hole 218 which penetrates the third insulating layer 216.

For example, as illustrated in FIG. 4, the driving transistor is a bottom gate type thin film transistor. The driving transistor 40 comprises a gate electrode 208, a gate insulating layer 211 disposed on the gate electrode 208, an active layer 212 disposed on the gate insulating layer 211, a second insulating layer 215 disposed on the active layer 212, a first electrode 213 and a second electrode 214 disposed on the second insulating layer 215.

For example, as illustrated in FIG. 4, the gate electrode 208 of the driving transistor 40 and the second power line 206 are disposed in a same layer, the material of the gate electrode 208 of the driving transistor 40 is identical to the material of the second power line 206. The gate electrode 208 and the second power line 206 are arranged in a same layer and spaced apart from each other.

For example, as illustrated in FIG. 4, the first electrode 213 of the driving transistor 40 is electrically connected to the second power line 206 through the second via hole 217 which penetrates the second insulating layer 215 and the gate insulating layer 211. In this way, the first electrode 213 of the driving transistor 40 is electrically connected to the second power line 206, the second power line 206 is electrically connected to the first power line 205, and a triple-layer parallel structure is formed to further reduce the resistance of the first power line 205 and the resistance of the second power line 206, then to further reduce the voltage drop.

Figure 5:
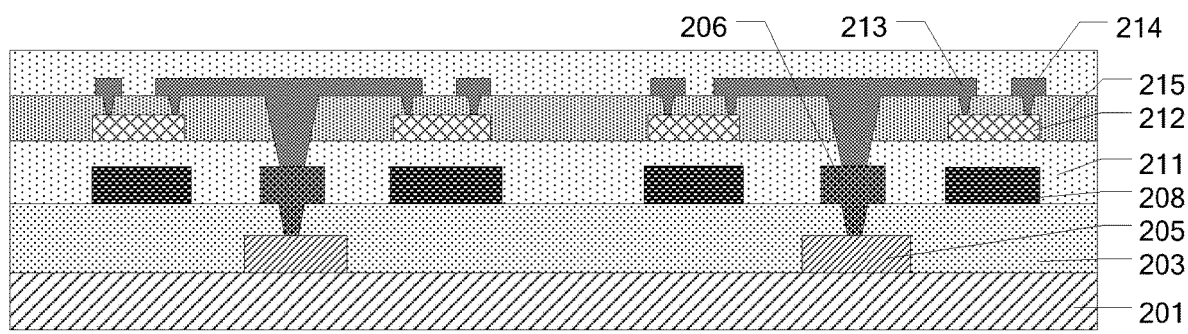
FIG. 5 is a schematic diagram of a sectional structure of an organic light-emitting diode array substrate provided by an embodiment of the present disclosure.

For example, FIG. 5 is a schematic diagram of a sectional structure of an organic light-emitting diode array substrate provided by an embodiment of the present disclosure. It can be seen from FIG. 5, the driving transistors of the plurality of pixel units are arranged side by side, and a triple-layer parallel structure as described above is formed between the driving transistors of each pair of adjacent pixel units. That is, the first electrode 213 of the driving transistor 40 is electrically connected to the second power line 206, and the triple-layer parallel structure is formed by the electrically connection of the second power line 206 and the first power line 205.

For example, as illustrated in FIG. 4, a material of the third electrode 501 in the OLED device 50 may comprise a transparent conductive material, and the transparent conductive material comprises indium tin oxide (ITO), indium zinc oxide (IZO), indium gallium oxide (IGO), zinc gallium oxide (GZO)), zinc oxide (ZnO), Indium oxide ($In_2O_3$), aluminum zinc oxide (AZO) and carbon nanotubes. The third electrode 501 may also comprise a metal conductive material, and the metal conductive material comprises a single metal such as Cu, Cr, Mo, Au, Ag and Pt metal, or an alloy material formed of the above metals, for example, a copper chromium alloy (CuCr) or a chromium molybdenum alloy (CrMo).

For example, the driving transistor further comprises an active layer 212, the material of the active layer 212 comprises a transparent conductive material.

For example, the material of the active layer 212 comprises indium tin oxide (ITO), indium zinc oxide (IZO), indium gallium oxide (IGO), gallium zinc oxide (GZO), zinc oxide (ZnO), indium oxide ($In_2O_3$), aluminum oxide zinc (AZO) and carbon nanotubes, etc.

For example, a thickness of the third electrode 501 is from 40 nm to 120 nm. For example, a thickness of the third electrode 501 is 40 nm, 50 nm, 60 nm, 70 nm, 80 nm, 90 nm, 100 nm, 110 nm, or 120 nm.

For example, the material of the fourth electrode 503 in the OLED device 50 comprises a single metal such as silver, magnesium, aluminum, and lithium, or magnesium aluminum alloy (MgAl), lithium aluminum alloy (LiAl), etc.

For example, a thickness of the fourth electrode 503 is from 3 nm to 30 nm. For example, a thickness of the fourth electrode 503 is 5 nm, 10 nm, 15 nm, 20 nm, 25 nm, or 30 nm.

For example, in FIG. 4, the pixel defining layer 504 of the OLED device 50 is generally made of an organic insulating material (for example, acrylic resin) or an inorganic insulating material (for example, silicon nitride $SiN_x$ or silicon oxide $SiO_x$), and the pixel defining layer 504 has an insulation property. In FIG. 4, the pixel defining layer 504 is an insulating structure disposed between the third electrode 501 and the fourth electrode 503.

For example, the third electrode 501 is an anode, the fourth electrode 503 is a cathode, or the third electrode 501 is a cathode, and the fourth electrode 503 is an anode.

It should be noted that, the material and the structure of the third electrode 501 and the fourth electrode 503 are merely examples in the embodiments of the present disclosure, the third electrode 501 and the fourth electrode 503 may also be made of other materials. The OLED array substrate is divided into a single-side light-emitting array substrate and a double-side light-emitting array substrate depending on different materials of the third electrode and the fourth electrode. If the material of one of the anode and the cathode is opaque or semitransparent material, the array substrate is a single-side light-emitting type. If the material of both the anode electrode and the cathode electrode is light-transmitting material and/or semitransparent material, the array substrate is double-side light-emitting array substrate.

For a single-side light-emitting OLED array substrate, the OLED array substrate is divided into a top light-emitting type and bottom light-emitting type, depending on different materials of the anode and the cathode. In the case that the anode is close to the base substrate, and the cathode is away from the base substrate, and the material of the anode is a light-transmitting conductive material and the material of the cathode is an opaque conductive material, because light is emitted from the anode and then exited from the base substrate, it can be called as the bottom light-emitting type. In the case that the material of the anode is an opaque conductive material and the material of the cathode is a transparent or a translucent conductive material, the light exits from a side of the cathode away from the substrate, it is called as the top light-emitting type. The relative positions of the anode and the cathode in the above-mentioned two types may also be replaced, and detailed descriptions will be omitted herein.

For a double-side light-emitting array substrate, in the case that the anode is close to the base substrate, the cathode is away from the base substrate, and the materials of the anode and the cathode are both light-transmitting conductive materials and/or translucent materials, on one hand, since light exits from the anode and a surface of the base substrate, and on the other hand, light exits from a side of the cathode away from the base substrate, the above-mentioned OLED array substrate is referred to as a double-side light-emitting type. Herein, the anode may be disposed away from the base substrate, and the cathode may be disposed close to the base substrate.

For example, the organic material functional layer 502 of the OLED device may comprise a hole transport layer, a light emitting layer, and an electron transport layer. In order to improve the efficiency of injecting the electrons and holes into the light-emitting layer, the organic material functional layer may further comprise an electron injection layer disposed between the cathode and the electron transport layer and a hole injection layer disposed between the anode and the hole transport layer and other organic functional layers. The materials and sizes of these organic material functional layers are determined according to conventional design, which are not limited in the embodiment of the present disclosure.

In addition, because water and oxygen make great impact on the performance of the cathode and the organic material functional layers, as illustrated in FIG. 4, a passivation layer 505 and an encapsulation layer 506 are disposed on the fourth electrode 503 of the OLED array substrate.

For example, a material of the passivation layer 505 comprises silicon nitride ($SiN_x$), silicon oxide ($SiO_x$), acrylic resin and so on.

For example, the encapsulation layer 506 comprises a single film or a composite film formed of silicon nitride, silicon oxide, or photosensitive resin. For example, the photosensitive resin is a polyacrylic resin, a polyimide resin or a polyamide resin and so on.

For example, the driving transistor and the switching transistor provided in the embodiments of the present disclosure may be a bottom-gate structure, a top-gate structure, or a double-gate structure. For example, the driving transistor as illustrated in FIG. 4 is the bottom-gate structure. The top-gate structure and the bottom-gate structure are determined by the relative positions of the active layer and the gate electrode; that is, compared to the base substrate, in the case that the gate electrode is close to the base substrate, and the active layer is away from the base substrate, the thin film transistor is a bottom-gate type thin film transistor; in the case that the gate electrode is away from the base substrate, while the active layer is closer to the base substrate, the thin film transistor is a top-gate type thin film transistor; the double-gate structure comprises both the structure that the gate electrode is away from the base substrate, while the active layer is closer to the base substrate and the structure that the gate electrode is close to the base substrate, and the active layer is away from the base substrate.

For example, as illustrated in FIG. 4, the driving transistor is a bottom-gate type thin film transistor, and the second power line 206 is disposed between the first power line 205 and the first electrode 213 of the driving transistor 40. In the case that the driving transistor is a top-gate type thin film transistor, the first power line is disposed between the second power line and the first electrode of the driving transistor. The structures of the driving transistor of the top-gate structure and the double-gate structure may refer to the description of the bottom-gate structure described above, and detailed descriptions will be omitted herein.

For example, in the embodiments of the present disclosure, materials of the first insulating layer 203, the second insulating layer 215, and the third insulating layer 216 comprise an organic insulating material (for example, acrylic resin) or an inorganic insulating material (for example, silicon nitride $SiN_x$ or silicon oxide $SiO_x$).

For example, a material of the gate insulating layer 211 comprises silicon nitride ($SiN_x$), silicon oxide ($SiO_x$), aluminum oxide ($Al_2O_3$), aluminum nitride (AlN), or other suitable material.

For example, a width of the first power line 205 is greater than a width of the second power line 206. The width of the second power line 206 is relatively small which increases the aperture ratio of the pixel. The width of the first power line 205 is relatively large which reduces the resistance of the first power line 205, thereby the voltage drop is reduced.

For example, the first power line 205 has a planar shape. For example, the first power line 205 has a shape of plate as a whole. For example, the first power line 205 is an electrode in a planar shape that is made from a metal mesh (rather than a single bar or a single line), and the electrode in a planar shape made from the metal mesh comprises a plurality of mesh holes. The power line in a planar shape can reduce the voltage drop (IR drop) of the power line, so that the energy consumption of the OLED array substrate is reduced. It should be explained that, "the power line in a planar shape" refers to the power line has a certain size and a certain extension range in both the width direction and the length direction of the pixel structure.

For example, in one example, each column of pixel structure (sub-pixel) corresponds to a power line in a planar shape, so that multiple of power lines in planar shapes are connected to each other to form an integrated structure, which makes the area of power lines larger, thereby further reducing the voltage drop of the power lines (IR drop) and reducing the energy consumption of the OLED array substrate.

Figure 6:
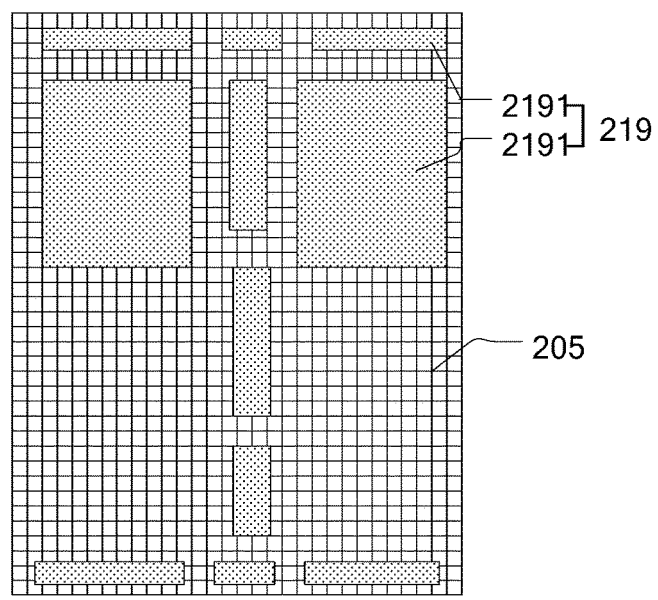
FIG. 6 is a schematic diagram of a planar structure that a first power line is arranged as a hollow structure provided by an embodiment of the present disclosure.

For example, FIG. 6 is a schematic diagram of a planar structure that a first power line is arranged as a hollow structure provided by an embodiment of the present disclosure. As illustrated in FIG. 6, the region of the first power line in a planar shape, which corresponds to the pixel structure, the gate lines and the data lines, is provided with at least one hollow structure 219. It should be noted that, the size of the hollow structure 219 corresponds to a size of the pixel structure, the gate lines and the data lines; the size of the hollow structure 209 is larger than the size of the mesh in the metal mesh. For example, the region of the first power line corresponds to the pixel structure provided is set to a hollow structure 219 to prevent shading by metal lines, and thus the transmittance of light is not reduced, that is, the power line in a planar shape provided with at least one hollow structure corresponding to the pixel structure can increase the transmittance of light and make full use of the incident light; and the first power line provided with at least one hollow structure corresponding to the gate lines and the data lines can eliminate capacitance formed between the first power line and the gate lines or the data lines. For example, as illustrated in FIG. 6, the hollow structure 219 may comprise a plurality of discontinuous hollow sub-structures 2191 (that is a plurality of hollow sub-structures are separated from each other), in this way, the power line in a planar shape is divided into a plurality of parallel regions, and the voltage drop of the power line can also be greatly reduced.

Figure 7:
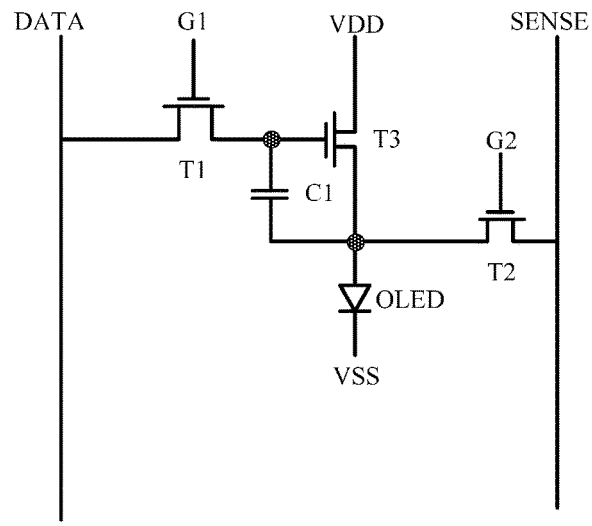
FIG. 7 is a schematic diagram of a 3T1C pixel circuit provided by an embodiment of the present disclosure.

For example, FIG. 7 is a schematic diagram of a 3T1C compensation pixel circuit (three transistors and one capacitor) provided by an embodiment of the present disclosure. The compensation pixel circuit is based on a conventional 2T1C pixel circuit to realize an external compensation function. Combining FIG. 4 with FIG. 7, it can be seen that, in addition to the switching transistor T1, T2 and the driving transistor T3, the pixel structure further comprises a storage capacitor C1, one end of the storage capacitor C1 is electrically connected to the drain electrode of the driving transistor T1, and the other end of the storage capacitor C1 is connected to the drain electrode of the switching transistor T3. For example, the gate electrode of the switching transistor T1 is used for receiving the scanning signal G1 and the source electrode of the switching transistor T1 is used for receiving the data signal DATA; the gate electrode of the switching transistor T2 is used for receiving the scanning signal G1, and the drain electrode of the switching transistor T2 is used for outputting sensing signal to the sense line (SENSE). The source electrode is electrically connected to the drain electrode of the driving transistor T2, the gate electrode of the driving transistor T3 is electrically connected to the drain electrode of the switching transistor T1, the source electrode is electrically connected to the power voltage (VDD), and the anode of the OLED is electrically connected to the drain electrode of the driving transistor T3, and the cathode of the OLED is electrically connected to the power voltage (VSS). In the pixel circuit described above, each of the transistors is a P-type transistor, it may also be an N-type transistor, and the driving signal is changed accordingly. For example, in at least one embodiment of the present disclosure, the pixel circuit may also be a 4T2C structure etc. In addition to the above mentioned switching transistor and the driving transistor, a compensation transistor and a reset transistor may also be included, which is not limited in the embodiments of the present disclosure.

At least one embodiment of the present disclosure further provides a display apparatus, which comprises any one of the above mentioned organic light-emitting diode (OLED) array substrates. Other structures in the display apparatus may refer to the conventional design. The display apparatus may be any product or component having a display function such as an OLED panel, a cell phone, a tablet computer, a television, a display, a notebook computer, a digital photo frame and a navigator.

Figure 8:
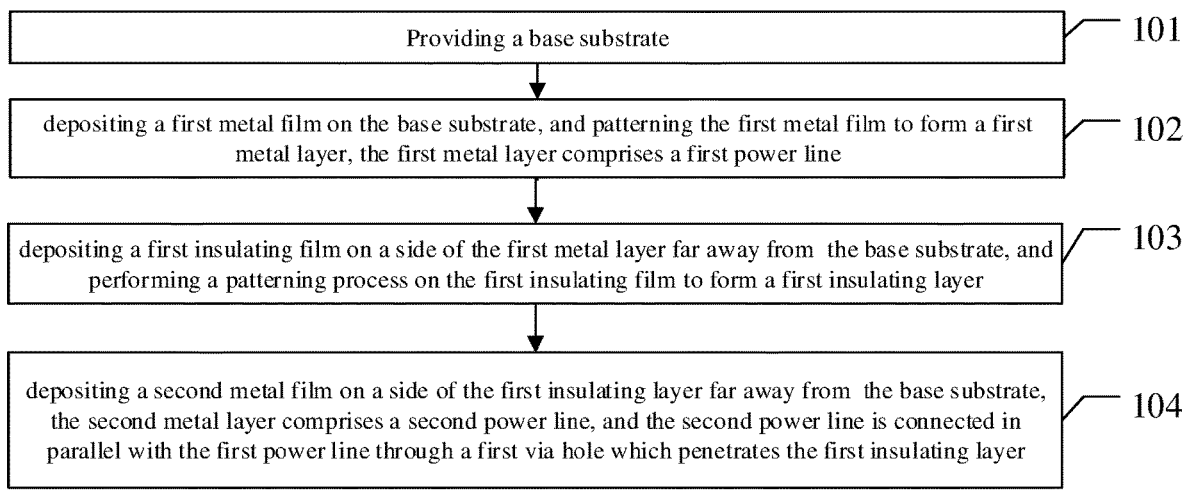
FIG. 8 is a flow diagram of a method for manufacturing an organic light-emitting diode array substrate provided by an embodiment of the present disclosure.

At least one embodiment of the present disclosure also provides a method for manufacturing an organic light-emitting diode (OLED) array substrate. For example, FIG. 8 is a flow diagram of a method for manufacturing an organic light-emitting diode array substrate provided by an embodiment of the present disclosure. As illustrated in FIG. 8, the manufacturing method comprises the following proceedings:

Step 101: provide a base substrate.

For example, the base substrate is a glass substrate, a quartz substrate, or a plastic substrate, etc.

Step 102: depositing a first metal film on the base substrate, and patterning the first metal film to form a first metal layer, the first metal layer comprises a first power line.

For example, the material of the first metal layer comprises at least one of copper, copper alloy, silver, and silver alloy.

Step 103: depositing a first insulating film on a side of the first metal layer far away from the base substrate, and performing a patterning process on the first insulating film to form a first insulating layer.

For example, the material of the first insulating layer may comprise an organic insulating material (for example, acrylic resin) or an inorganic insulating material (for example, silicon nitride $SiN_x$ or silicon oxide $SiO_x$).

Step 104: depositing a second metal film on a side of the first insulating layer far away from the base substrate, and performing a patterning process on the second metal film to form a second metal layer, the second metal layer comprises a second power line, and the second power line is connected in parallel with the first power line through a first via hole which penetrates the first insulating layer.

For example, the second power line is connected in parallel with the first power line by at least two first via holes which penetrate the first insulating layer, in this way, the first power line and the second power line are connected in parallel at a plurality of positions to further reduce voltage drop. For example, plurality of the first via holes is formed in a same patterning process. Compared to forming one first via hole, forming a plurality of first via holes at a same time require no additional operations, and only require to choose different masks.

For example, the second metal layer further comprises a metal electrode disposed in a same layer as the second power line, in this way, the number of operations is reduced, and the process is simplified. Exemplary, the second power line is disposed in a same layer as the gate electrode of the driving transistor.

For example, in the manufacturing method provided by at least one embodiments of the present disclosure, a resistivity of a material of the first metal layer is less than a resistivity of a material of the second metal layer. In this way, the metal electrode made of a same material as the second power line and the first power line have different resistivity, and the first power line and the second power line are connected in parallel, in this way, the problem of large voltage drop is avoided in the case that the power line is made of a metal material such as aluminum with a good stability, and the problem of immature process is avoided in the case that the electrodes are made of copper or silver, or metal alloys comprising at least one of copper and silver with low resistivity.

For example, the material of the second metal layer comprises at least one of nickel, molybdenum, tantalum, aluminum, titanium, and alloy of any combination thereof. For example, the alloy comprises a nickel molybdenum alloy, a nickel niobium alloy, a niobium molybdenum alloy, an aluminum molybdenum alloy, a titanium molybdenum alloy, an aluminum antimony alloy, an aluminum titanium alloy, a titanium rhenium alloy, a nickel molybdenum tantalum alloy.

For example, in the manufacturing method provided by at least one embodiments of the present disclosure, the width of the first power line is greater than the width of the second power line.

For example, the width of the second power line is relatively small which increases the aperture ratio of the pixel. The width of the first power line is relatively large which reduces the resistance of the first power line, thereby the voltage drop is reduced.

For example, the first power line has a planar shape. For example, the first power line is an electrode in a planar shape that is made from a metal mesh (rather than a single bar or a single line), and the electrode in a planar shape made from the metal mesh comprises a plurality of mesh holes. The first power line in a planar shape can reduce the voltage drop (IR drop) of the power line, so that the energy consumption of the OLED array substrate is reduced. It should be explained that, the power line in a planar shape refers to the power line has a size and an extension range in both the width direction and the length direction of the pixel structure.

For example, the manufacturing method provided by at least one embodiment of the present disclosure further comprises forming a driving transistor, the driving transistor comprises a gate electrode, a gate insulating layer, an active layer, a second insulating layer, a first electrode and a second electrode.

For example, the gate electrode of the driving transistor and the second power line are disposed in a same layer, the material of the gate electrode of the driving transistor is the same as the material of the second power line. The gate electrode and the second power line are arranged at a same layer and spaced apart from each other.

For example, the first electrode of the driving transistor (that is the input electrode of the driving transistor) is electrically connected to the second power line by the second via hole which penetrates both the second insulating layer and the gate insulating layer. In this way, the first electrode of the driving transistor is electrically connected to the second power line, the second power line is electrically connected to the first power line, and a triple-layer parallel structure is formed to further reduce the resistance of the first power line and the resistance of the second power line, then to further reduce the voltage drop.

For example, in the OLED array substrate provided by at least one embodiment of the present disclosure, in the case that the driving transistor is a bottom-gate type thin film transistor, the second power line is disposed between the first power line and the first electrode of the driving transistor. In the case that the driving transistor is a top-gate type thin film transistor, the first power line is disposed between the second power line and the first electrode of the driving transistor. Each of the structures of the driving transistor of the top-gate structure may refer to the description of the bottom-gate structure described above, and detailed descriptions will be omitted herein.

For example, in the manufacturing method provided by at least one embodiment of the present disclosure, the second power line is electrically connected to the first electrode of the driving transistor by the second via hole of the second insulating layer.

The organic light-emitting diode (OLED) array substrate and manufacturing method thereof and the display apparatus provided by at least one embodiment of the present disclosure have at least one of the following beneficial effects:

(1) in the organic light-emitting diode (OLED) array substrate provided by at least one embodiment of the present disclosure, the electrodes and the second power line of the driving transistor are made of aluminum having a good stability; the first power line is made of copper or silver with a relatively low resistivity or a metal alloy comprising at least one of copper and silver;

(2) in the organic light-emitting diode (OLED) array substrate provided by at least one embodiment of the present disclosure, the first power line and the second power line are connected in parallel through the via hole to reduce the voltage drop, in this way, the problem of large voltage drop is avoided in the case that the power line is made of a metal material such as aluminum with a good stability, and the problem of immature process is avoided in the case that the electrodes are made of copper or silver, or metal alloys comprising at least one of copper and silver with low resistivity.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. An organic light-emitting diode array substrate comprising:
 a base substrate;
 a first metal layer disposed on the base substrate;
 a first insulating layer disposed on a side of the first metal layer far away from the base substrate; and
 a second metal layer disposed on a side of the first insulating layer far away from the base substrate,
 wherein the first metal layer comprises a first power line, and the second metal layer comprises a second power line,
 the second power line is connected in parallel with the first power line through a first via hole which penetrates the first insulating layer, and
 the first power line has a surface structure formed by a metal mesh, the surface structure is provided with a hollow structure, a size of the hollow structure is larger than a size of a mesh in the metal mesh, and the hollow structure comprises a plurality of discontinuous hollow sub-structures.

2. The organic light-emitting diode array substrate according to claim 1, wherein a resistivity of a material of the first metal layer is less than a resistivity of a material of the second metal layer.

3. The organic light-emitting diode array substrate according to claim 2, wherein the material of the first metal layer comprises at least one of copper, copper alloy, silver, and silver alloy; and the material of the second metal layer comprises at least one of nickel, molybdenum, tantalum, aluminum, titanium, and any alloy of any combination thereof.

4. The organic light-emitting diode array substrate according to claim 1, wherein the second power line is connected in parallel with the first power line through at least two first via holes which penetrate the first insulating layer.

5. The organic light-emitting diode array substrate according to claim 1, wherein a width of the first power line is greater than a width of the second power line.

6. The organic light-emitting diode array substrate according to claim 1, further comprising a pixel structure,
wherein the pixel structure comprises a driving transistor,
the driving transistor comprises a gate electrode, a gate insulating layer, a second insulating layer, and a first electrode, and
the first electrode is electrically connected to the second power line through a second via hole which penetrates both the second insulating layer and the gate insulating layer.

7. The organic light-emitting diode array substrate according to claim 6, wherein a material of the gate electrode is identical to a material of the second power line, and the gate electrode and the second power line are arranged in a same layer and spaced apart from each other.

8. The organic light-emitting diode array substrate according to claim 6, wherein the driving transistor further comprises an active layer, and a material of the active layer comprises a metal oxide.

9. The organic light-emitting diode array substrate according to claim 8, wherein the metal oxide comprises at least one of indium tin oxide (ITO), indium zinc oxide (IZO), indium gallium oxide (IGO), gallium zinc oxide (GZO), zinc oxide (ZnO), indium oxide ($In_2O_3$), and aluminum zinc oxide (AZO).

10. A display apparatus, comprising the organic light-emitting diode array substrate according to claim 1.

11. The organic light-emitting diode array substrate according to claim 2, wherein a width of the first power line is greater than a width of the second power line.

12. The organic light-emitting diode array substrate according to claim 4, wherein a width of the first power line is greater than a width of the second power line.

13. The organic light-emitting diode array substrate according to claim 2, wherein the second power line is connected in parallel with the first power line through at least two first via holes which penetrate the first insulating layer.

14. A method for manufacturing an organic light-emitting diode array substrate, comprising:
providing a base substrate;
depositing a first metal film on the base substrate and patterning the first metal film to form a first metal layer;
depositing a first insulating film on a side of the first metal layer far away from the base substrate, and performing a patterning process on the first insulating film to form a first insulating layer; and
depositing a second metal film on a side of the first insulating layer far away from the base substrate, and performing a patterning process on the second metal film to form a second metal layer,
wherein the first metal layer comprises a first power line, and the second metal layer comprises a second power line,
the second power line is connected in parallel with the first power line through a first via hole which penetrates the first insulating layer, and
the first power line has a surface structure formed by a metal mesh, the surface structure is provided with a hollow structure, a size of the hollow structure is larger than a size of a mesh in the metal mesh, and the hollow structure comprises a plurality of discontinuous hollow sub-structures.

15. The method according to claim 14, wherein a resistivity of the first metal layer is less than a resistivity of the second metal layer.

16. The method according to claim 14, wherein a width of the first power line is greater than a width of the second power line.

17. The method according to claim 16, further comprising forming a pixel structure,
wherein the forming the pixel structure comprises forming a driving transistor,
the forming the driving transistor comprises forming a gate electrode, a gate insulating layer, a second insulating layer, and a first electrode, wherein the first electrode is electrically connected to the second power line through a second via hole which penetrates both the second insulating layer and the gate insulating layer.

18. The method according to claim 17, wherein a material of the gate electrode is identical to a material of the second power line, and the gate electrode and the second power line are arranged in a same layer and spaced apart from each other.

19. The method according to claim 15, wherein a width of the first power line is greater than a width of the second power line.

* * * * *